(12) United States Patent
Moision et al.

(10) Patent No.: US 10,447,313 B2
(45) Date of Patent: Oct. 15, 2019

(54) COMMUNICATION METHOD AND SYSTEM WITH ON DEMAND TEMPORAL DIVERSITY (71) Applicant: X Development LLC, Mountain View, CA (US)

(72) Inventors: Bruce Moision, Palo Alto, CA (US); Edward Keyes, Mountain View, CA (US); Baris Erkmen, Mountain View, CA (US); Oliver Bowen, Redwood City, CA (US)

(73) Assignee: X Development LLC, Mountain View, CA (US)

( * ) Notice: Subject to any disclaimer, the term of this patent is extended or adjusted under 35 U.S.C. 154(b) by 0 days.

(21) Appl. No.: 15/824,111

(22) Filed: Nov. 28, 2017

(65) Prior Publication Data

US 2019/0165815 A1 May 30, 2019

(51) Int. Cl.
*H03M 13/27* (2006.01)
*H04L 1/00* (2006.01)

(52) U.S. Cl.
CPC ...... *H03M 13/2792* (2013.01); *H04L 1/0041* (2013.01); *H04L 1/0045* (2013.01); *H04L 1/0058* (2013.01); *H04L 1/0071* (2013.01)

(58) Field of Classification Search
CPC ............ H03M 13/2792; H04L 1/0045; H04L 1/0071; H04L 1/0041; H04L 1/0058
See application file for complete search history.

(56) References Cited

U.S. PATENT DOCUMENTS

| | | | |
|---|---|---|---|
| 6,571,369 B1 * | 5/2003 | Li | H03M 13/2771 714/792 |
| 6,731,878 B1 | 5/2004 | Britz et al. | |
| 8,205,145 B2 * | 6/2012 | Lee | G06F 7/22 714/796 |
| 2002/0147954 A1 | 10/2002 | Shea | |
| 2007/0033513 A1 * | 2/2007 | Harada | H03M 13/2903 714/801 |
| 2007/0162831 A1 | 7/2007 | Takashi et al. | |
| 2008/0172590 A1 * | 7/2008 | Shen | H03M 13/2757 714/755 |

(Continued)

FOREIGN PATENT DOCUMENTS

| | | | | |
|---|---|---|---|---|
| KR | 20020045403 A | * | 6/2002 | H04J 11/00 |
| KR | 2007111406 A | * | 9/2007 | H04N 7/015 |

OTHER PUBLICATIONS

International Search Report and Written Opinion for application No. PCT/US2018/062056 dated Mar. 15, 2019.

*Primary Examiner* — Cynthia Britt
(74) *Attorney, Agent, or Firm* — Botos Churchill IP Law (57) ABSTRACT

The disclosure may provide for a communication method and system. A transmitter of the communication system may include an interleaver and a first encoder for determining parity bits. The transmitter also may include a multiplexer for joining the parity bits with the data. A second encoder may be positioned after the multiplexer for implementing an error correcting code. A receiver of the communication system may include a decoder followed by an interleaver. When errors are detected in received data at the decoder, one or more processors of the receiver may be configured to correct portions of the received data and combine the corrected portions with the received data.

20 Claims, 10 Drawing Sheets

(56) References Cited

U.S. PATENT DOCUMENTS

| | | | |
|---|---|---|---|
| 2008/0313522 A1* | 12/2008 | Kim | H03M 13/2721 |
| | | | 714/752 |
| 2009/0044072 A1* | 2/2009 | Oh | H03M 13/2707 |
| | | | 714/758 |
| 2009/0199073 A1 | 8/2009 | Toshikazu et al. | |
| 2013/0080852 A1 | 3/2013 | Horita | |
| 2013/0163649 A1* | 6/2013 | Zheng | H04L 1/1819 |
| | | | 375/219 |
| 2014/0053042 A1 | 2/2014 | Wang et al. | |
| 2015/0003564 A1* | 1/2015 | Murakami | H04L 1/22 |
| | | | 375/298 |

\* cited by examiner

100 Block diagram
FIGURE 1

200 Transmit architecture
FIGURE 2

300A Diagram
FIGURE 3A

300B Diagram
FIGURE 3B

300C Diagram
FIGURE 3C

400 Receive architecture
FIGURE 4

500A Diagram
FIGURE 5A

500B Diagram
FIGURE 5B

500C Diagram
FIGURE 5C

500D Diagram
FIGURE 5D

500E Diagram
FIGURE 5E

600 Receive architecture
FIGURE 6

COMMUNICATION METHOD AND SYSTEM WITH ON DEMAND TEMPORAL DIVERSITY

BACKGROUND

Information transmitted between communication devices may sometimes be lost or contain other errors. For example, in certain communication devices, the received power may fluctuate, or fade, over time. This results in data losses when the power drops below a threshold. Temporal diversity may be used to recover the lost data, which includes transmitting smaller blocks of data over a longer period of time. This allows the fraction of errors in any block to be kept small enough that it can be corrected with an error correcting code.

BRIEF SUMMARY

Aspects of the disclosure provide for a method. The method includes using one or more processors of a communication device to transmit a signal carrying data on a first path and a second path, interleave the data on the first path, and encode the interleaved data to determine parity bits. The data on the second path is then multiplexed by the one or more processors with the determined parity bits to form a multiplexed signal, and the multiplexed signal is encoded using an error correcting code to form an output signal. The method also includes using the one or more processors to transmit the output signal.

In one example, the data is interleaved using a convolutional interleaver. In another example, the output signal is transmitted as a free-space optical communication signal. The method also optionally includes using one or more second processors of a second communication device to receive the output signal as an input signal, decode the input signal to identify second data, and extract the second data from the input signal for processing.

The method alternatively or additionally includes using one or more second processors of a second communication device to receive the output signal as an input signal and decode the input signal to obtain second data. In this example, the one or more second processors is used to identify one or more errors in the input signal and locations of the one or more errors, produce one or more erasures in the second data at the locations of the one or more errors. In addition, the one or more second processors de-interleaves the second data in the input signal, corrects the one or more erasures to obtain corrected second data, and combines the corrected second data and the second data to form complete corrected data.

Optionally, in this example, the corrected second data and the second data is combined by receiving an index indicating a location of the one or more erasures and replacing portions of the second data with portions of the corrected second data according to the index. Correcting the second data in this example alternatively or additionally includes reordering the de-interleaved second data. Also in this example, the corrected second data and the second data are optionally combined by inserting the corrected second data in locations in the second data, the locations in the second data corresponding to at least one of the locations of the one or more errors.

Other aspects of the disclosure provide for a system. The system includes a transmitter including an interleaver configured to interleave data and a first encoder configured to encode the interleaved data to determine parity bits. In addition, the system includes a multiplexer configured to multiplex the data with the determined parity bits and a second encoder implementing an error correcting code. The second encoder is configured to encode the multiplexed data.

In one example, the interleaver is a convolutional interleaver. In another example, the transmitter is configured to transmit the multiplexed data using a free-space optical communication signal. The system optionally also includes a receiver including a decoder configured to decode an input signal to obtain second data and one or more processors configured to extract the second data from the input signal for processing.

The system alternatively or additionally also includes a receiver and one or more processors. The receiver in this example includes a decoder being configured to decode an input signal to obtain second data and a de-interleaver configured to de-interleave the second data. The one or more processors in this example is configured to correct the second data where erasures are located, combine the corrected second data and the second data to form complete corrected data, and forward the complete corrected data for processing.

Optionally, the one or more processors are also configured to identify one or more errors in the second data and locations of the one or more errors. The second data in this example is corrected based on the locations of the one or more errors. Also in this example, the decoder is optionally further configured to produce an erasure in the second data at the locations of the one or more errors. Additionally or alternatively, the corrected second data and the second data are combined by inserting the corrected second data in locations in the second data, the locations in the second data corresponding to the locations of the one or more errors. Correcting the second data also optionally includes reordering the second data.

Further aspects of the disclosure provide for a non-transitory, tangible computer-readable storage medium on which computer readable instructions of a program are stored. The instructions, when executed by one or more processors, cause the one or more processors to perform a method. The method includes transmitting a signal carrying data on a first path and a second path, interleaving the data on the first path, and encoding the interleaved data to determine parity bits. In addition, the method includes multiplexing the data on the second path with the determined parity bits to form a multiplexed signal, encoding the multiplexed signal using an error correcting code to form an output signal, and transmitting the output signal.

In one example, the method also includes receiving the output signal as an input signal, decoding the input signal to obtain second data, and extracting the second data from the input signal for processing. In an another example, the method also includes receiving the output signal as an input signal and decoding the input signal to obtain second data. The method in this example further includes identifying one or more errors in the second data and locations of the one or more errors, producing one or more erasures in the second data at the locations of the one or more errors, and correcting the one or more erasures to obtain corrected second data, and combining the corrected second data and the second data to form complete corrected data.

DETAILED DESCRIPTION

Overview

The technology relates to a communication device configured to use a real-time path and a delayed path in parallel to transmit and receive a signal. A signal carrying data may be transmitted along the real-time path and the delayed path. On the delayed path, the signal is interleaved then encoded to obtain parity information, and after transmission the signal may be decoded and then de-interleaved to retrieve the data. On the real-time path, the signal may be encoded, transmitted, and decoded at a receiver, without any interleaving and de-interleaving. The data transmitted along the real-time path may be retrieved faster and with less processing overhead. The data transmitted along the delayed path may be retrieved and accessed only when errors are detected in the data from the real-time path. This minimizes the time and resources required on the receive side.

Example Systems

Figure 1:
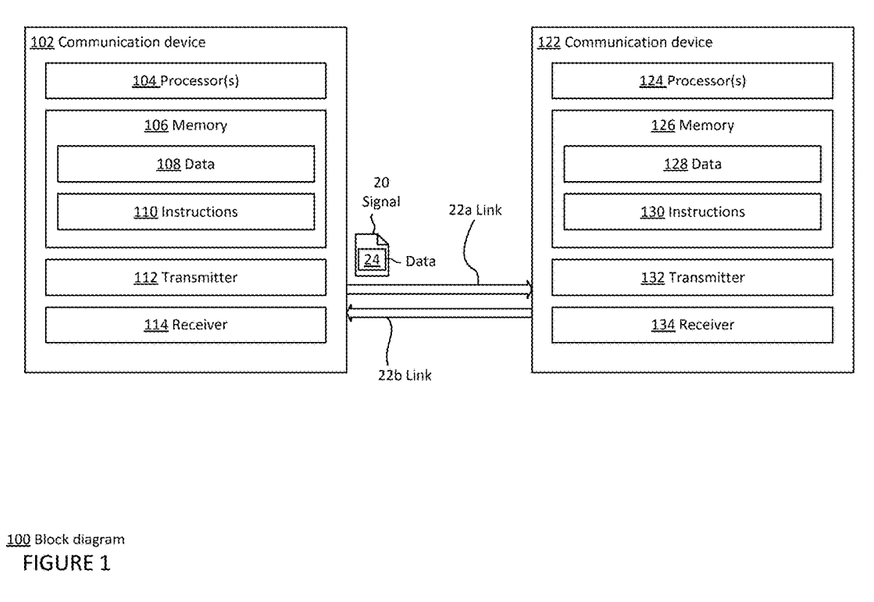
FIG. 1 is a block diagram 100 of a first communication device and a second communication device in accordance with aspects of the disclosure.

FIG. 1 is a block diagram 100 of a first communication device configured to form one or more links with a second communication device, for instance as part of a system such as a free-space optical communication system. For example, a communication device 102 includes one or more processors 104, a memory 106, a transmitter 112, and a receiver 114. The one or more processors 104 may be any conventional processors, such as commercially available CPUs. Alternatively, the one or more processors may be a dedicated device such as an application specific integrated circuit (ASIC) or other hardware-based processor, such as a field programmable gate array (FPGA). Although FIG. 1 functionally illustrates the one or more processors 104 and memory 106 as being within the same block, it will be understood that the one or more processors 104 and memory 106 may actually comprise multiple processors and memories that may or may not be stored within the same physical housing. Accordingly, references to a processor or computer will be understood to include references to a collection of processors or computers or memories that may or may not operate in parallel.

Memory 106 stores information accessible by the one or more processors 104, including data 108, and instructions 110, that may be executed by the one or more processors 104. The memory may be of any type capable of storing information accessible by the processor, including a computer-readable medium such as a hard-drive, memory card, ROM, RAM, DVD or other optical disks, as well as other write-capable and read-only memories. The system and method may include different combinations of the foregoing, whereby different portions of the data 108 and instructions 110 are stored on different types of media. In the memory of each communication device, such as memory 106, a routing table may be stored that indicate how signals received at each communication device should be routed, or transmitted. Data 108 may be retrieved, stored or modified by the one or more processors 104 in accordance with the instructions 110. For instance, although the system and method is not limited by any particular data structure, the data 108 may be stored in computer registers, in a relational database as a table having a plurality of different fields and records, XML documents or flat files. The data 108 may also be formatted in any computer-readable format such as, but not limited to, binary values or Unicode. By further way of example only, image data may be stored as bitmaps comprised of grids of pixels that are stored in accordance with formats that are compressed or uncompressed, lossless (e.g., BMP) or lossy (e.g., JPEG), and bitmap or vector-based (e.g., SVG), as well as computer instructions for drawing graphics. The data 108 may comprise any information sufficient to identify the relevant information, such as numbers, descriptive text, proprietary codes, references to data stored in other areas of the same memory or different memories (including other network locations) or information that is used by a function to calculate the relevant data.

The instructions 110 may be any set of instructions to be executed directly (such as machine code) or indirectly (such as scripts) by the one or more processors 104. For example, the instructions 110 may be stored as computer code on the computer-readable medium. In that regard, the terms "instructions" and "programs" may be used interchangeably herein. The instructions 110 may be stored in object code format for direct processing by the one or more processors 104, or in any other computer language including scripts or collections of independent source code modules that are interpreted on demand or compiled in advance. Functions, methods and routines of the instructions 110 are explained in more detail below.

The one or more processors 104 may also be in communication with the transmitter 112 and the receiver 114. Transmitter 112 and receiver 114 may be part of a transceiver arrangement in the communication device 102. The one or more processors 104 may therefore be configured to transmit, via the transmitter 112, data 24 in a signal, and also may be configured to receive, via the receiver 114, communications and data 24 in a signal, the received signal may be processed by the one or more processors 104 to extract the communications and data 24.

The transmitter 112 is configured to transmit a communication signal. In some examples, the communication signal may be a signal configured to travel through free space, such as, for example, a radio-frequency signal or optical signal. The transmitter 112 may receive a modulated communication signal 20 from a modulator (not shown), which in turn receives an electrical signal, and modulates the electrical signal. The transmitter 112 may receive the modulated electrical signal, convert the electrical signal into a communication signal, and output the communication signal towards another communication device, such as communication device 122. The communication signal may alternatively be an electrical signal transmitted through wire.

Communication device 122 includes one or more processors, 124, a memory 126, a transmitter 132, and a receiver 134. The one or more processors 124 may be similar to the one or more processors 104 described above. Memory 126 may store information accessible by the one or more processors 124, including data 128 and instructions 130 that may be executed by processor 124. Memory 126, data 128, and instructions 130 may be configured similarly to memory 106, data 108, and instructions 110 described above.

A communication link between a first communication device and a second communication device may be formed. For example, transmitter 112 of communication device 102 is be configured to form a communication link 22a with receiver 134 of communication device 122. Transmitter 132 of communication device 122 is configured to form a communication link 22b with receiver 114 of communication device 102. The communication links 22a, 22b allow for communication signal 20 between the two communication devices 102 and 122.

Figure 2:
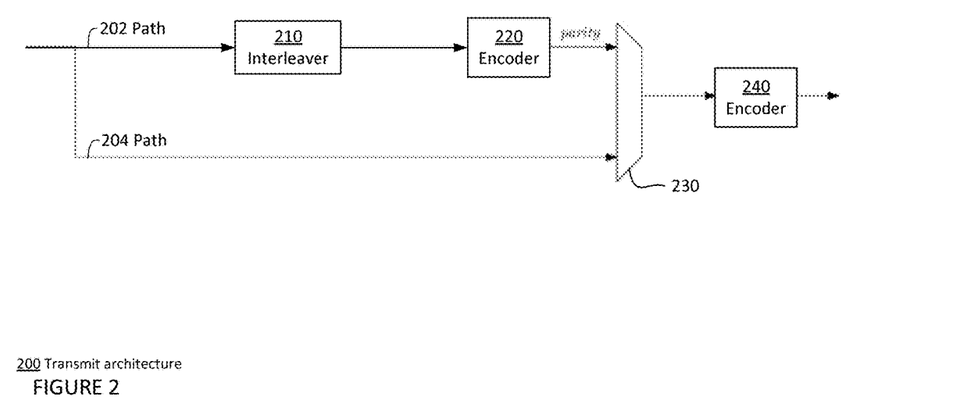
FIG. 2 is a pictorial diagram of a transmit architecture 200 in accordance with aspects of the disclosure.

As shown in FIG. 2, the transmitter 112 may include two paths in a transmit architecture 200 of the transmitter 112, namely a first path 202 and a second path 204. A signal carrying data may be transmitted along the first path 202 and the second path 204. The first path 202 includes an interleaver 210 and a first encoder 220 for implementing an erasure correcting code, while the second path 204 does not include either component. Along the first path, data may be processed to mix the data in a manner that may be reordered for error or erasure correction. The interleaver 210 may be configured to perform interleaving process shown in FIGS. 3A-3B. Blocks of data may be received as input in a particular order. Blocks of data may correspond to one or more bits of the data.

Figure 3A:
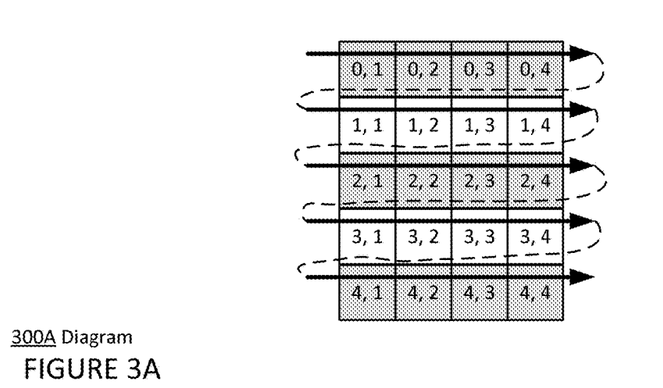
FIGS. 3A-3C are functional diagrams 300A, 300B, 300C of an encoding process in accordance with aspects of the disclosure.
Figure 3B:
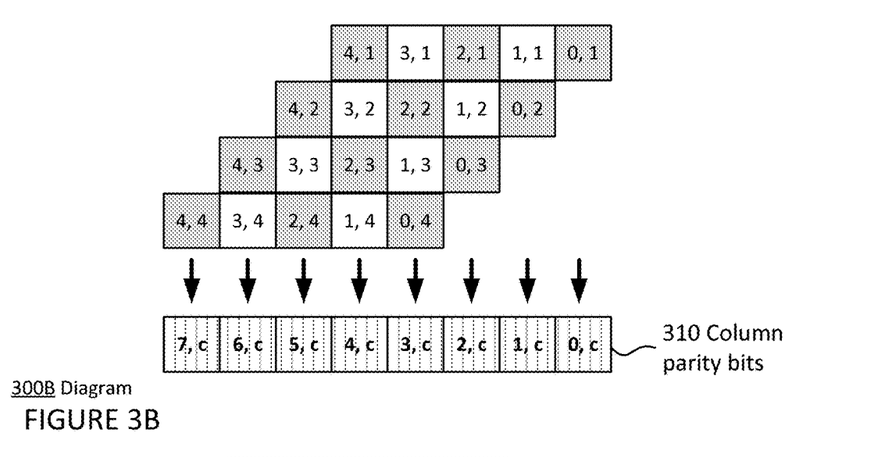

In the example shown in FIG. 3A, the blocks of data includes blocks (0,1), (0,2), (0,3), (0,4), (1,1), (1,2), (1,3), (1,4), (2,1), (2,2), (2,3), (2,4), (3,1), (3,2), (3,3), (3,4), (4,1), (4,2), (4,3), and (4,4). The blocks of data may be received in the order indicated by the arrows in FIG. 3A. The interleaver 210 may also reorganize the blocks of data, such as on a diagonal as shown in FIG. 3B. The first encoder may determine column parity bits 310 for the reorganized blocks of data. In this example, column parity bits include (0,c), (1,c), (2,c), (3,c), (4,c), (5,c), (6,c), and (7,c).

Figure 3C:
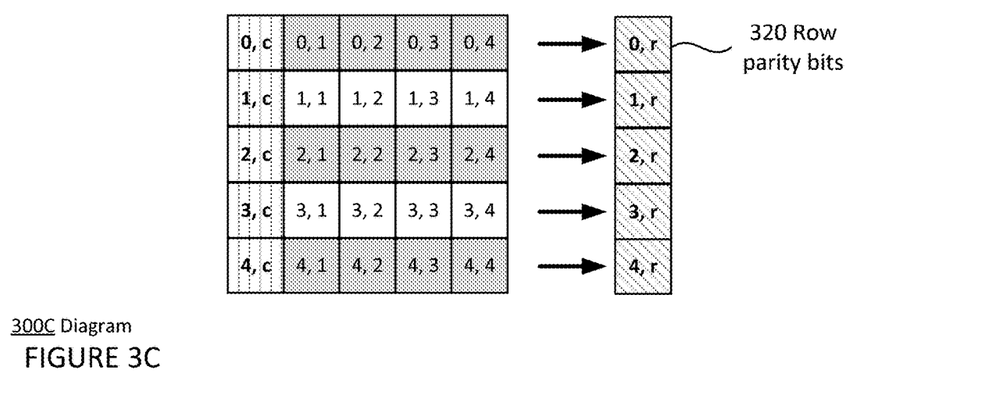

The data from the first path 202 and the second path 204 may be joined or otherwise integrated by a multiplexer 230. As shown, the multiplexer is positioned after the interleaver 210 and the first encoder 220 of the first path 202. The multiplexer 230 may insert the column parity bits 310 before each row of the data. As shown in FIG. 3C, row 0, which comprises blocks of data (0,1), (0,2), (0,3), and (0,4), is preceded by column parity bits (0,c). This set of data is followed by column parity bits (1,c) and blocks of data (1,1), (1,2), (1,3), and (1,4). The sets for rows 2, 3, and 4 are similarly multiplexed with column parity bits. For a given row of data, column parity bits may be inserted before the given row and row parity bits may be inserted after the given row. Along the second path 204, the data may be unprocessed by the interleaver 210 or the first encoder 220.

A second encoder 240 is shown positioned after the multiplexer 230 for implementing an error correcting code. The error correcting code of the second encoder 240 may be different from the erasure correcting code implemented by the first encoder 220. For example, the number of rows may be 64, a data block (i,j) may consist of 30592 bytes, the erasure correcting code may be a (70*30592, 64*30592)-byte code, and the error correcting code may be a (n,k)=(70*32640, 70*30592)-byte code. The codes may be implemented as a number of shorter codes, applied to sub-blocks. In the example just given, the row code can be implemented as 70 (n,k)=(32640, 30592)-byte codes, such as codes from the current Optical Transport Network (OTN) standard, and the column code may be implemented as 64 (n,k)=(33460, 30592)-byte codes (the encoders and decoders may be implemented as the code repeated 70 and 64 times, respectively).

The second encoder 240 may additionally or alternatively determine row parity bits that are inserted at the end of each row for error detection and correction purposes. As shown in FIG. 3C, the second encoder determines (0,r) as row parity bits for row 0, which includes blocks (0,c), (0,1), (0,2), (0,3), and (0,4). Thus, row parity bits (0,r) are inserted after the last block of row 0, resulting in row 0 having blocks (0,c), (0,1), (0,2), (0,3), (0,4), and (0,r). The same determination and insertion may be performed for rows 1 through 4. The row and column parity bits are shown as contiguous blocks in this example. However, these row and column parity bits may alternatively be interspersed with the data blocks to simplify buffering and reduce latency in encoding and decoding operations.

The resulting data from the second encoder 240 may be transmitted to a receiver of another communication device, such as receiver 134 of communication device 122. Because the data is follows the second path 204 without interleaving in the transmit architecture 200, the data may be received by the other communication device and immediately recovered after decoding using an error correcting code related to the error correcting code implemented by the second encoder 240. At the same time, the received data may also be de-interleaved and erasure-corrected using an erasure correcting code related to the erasure correcting code implemented by the first encoder 220 when needed. For example, the decoding error correcting code may be an inverse of the encoding error correcting code error correcting code, and the decoding erasure correcting code may be an inverse of the encoding erasure correcting code. The decoding error correcting code may be a (70*30592, 70*32640)-byte code, and the decoding erasure correcting code may be a (64*30592, 70*30592)-byte code. Similar to the encoding error correcting and erasure correcting codes, the decoding error correcting and erasure correcting codes may be implemented as a number of shorter codes, applied to sub-blocks.

Returning to FIG. 1, the receiver 114 is configured to receive a communication signal from the transmitter 112. When the received communication signal is a free-space optical communication signal, the receiver 114 may be configured to convert the received communication signal into an electric signal. Alternatively, the receiver 114 may not convert the optical communication signal into another format.

Figure 4:
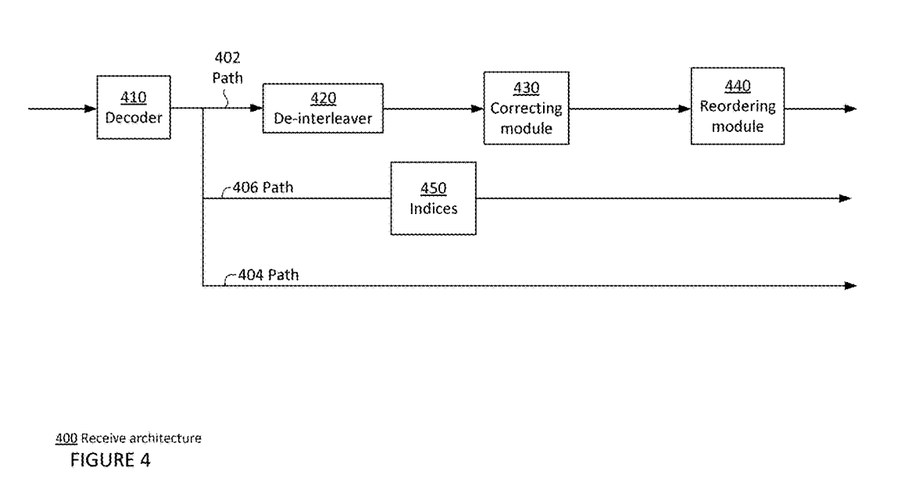
FIG. 4 is a pictorial diagram of a receive architecture 400 in accordance with aspects of the disclosure.
Figure 5A:
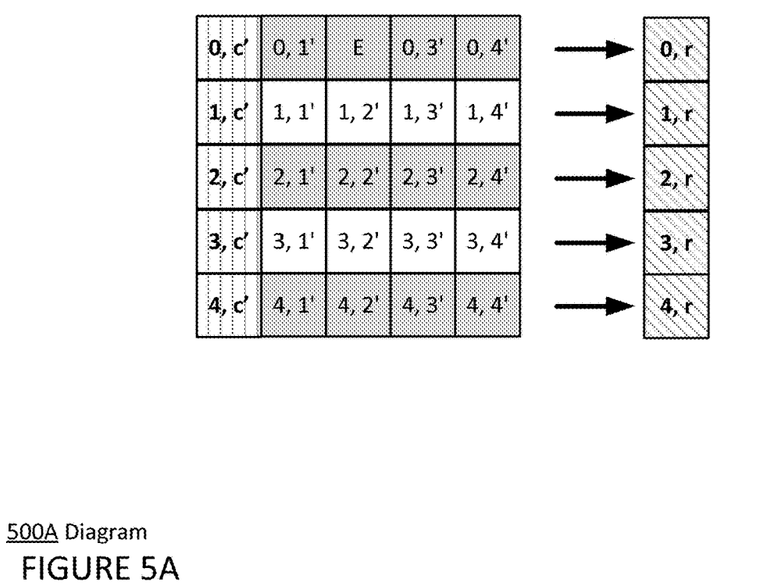
FIGS. 5A-5E are functional diagrams 500A, 500B, 500C, 500D, 500E of a decoding process in accordance with aspects of the disclosure.

As shown in FIG. 4, the receiver 114 includes a decoder 410 followed by two paths in a receive architecture 400 of the receiver 114, namely third path 402 and fourth path 404. At the decoder 410, received data may be processed to determine whether there are errors in the received data. Decoding the received data may include removing the row parity bits from the end of each row. As shown in FIG. 5A, row parity bits (0,r), (1,r), (2,r), (3,r), and (4,r) are removed from the rest of the data. For each block in the received data, the decoder 410 either successfully decodes or fails at decoding.

In addition to removing the row parity bits, the decoder 410 may be configured to identify when a decoding failure has occurred. When the decoding of a block in the received data fails, a block of erasures may be produced in place of the block and output with decoded portions of the received data. As shown in FIG. 5A, correctly decoded blocks have been marked with a prime (') symbol, and in place of where block (0,2) would be, is a block E indicating a block of erasures. The output of the decoder 410 in this example is therefore blocks (0,c)', (0,1)', (E), (0,3)', (0,4)', (1,c)', (1,1)', (1,2)', (1,3)', (1,4)', (2,c)', (2,1)', (2,2)', (2,3)', (2,4)', (3,c)', (3,1)', (3,2)', (3,3)', (3,4)', (4,c)', (4,1)', (4,2)', (4,3)', and (4,4)'.

Returning to FIG. 4, the entire output of the decoder 410, including both correctly decoded blocks and erasure blocks, may be forwarded along the third path 402, along with the column parity bits. The decoder 410 may also determine indices of the erased blocks 450 and forward the determined indices along a fifth path 406. In some alternatives, the determined indices may be forwarded along either the third path 402 or the fourth path 404. Along the third path 402 there is a de-interleaver 420, a correcting module 430, and a reordering module 440, while the fourth path 404 and the fifth path 406 do not include such components.

Figure 5B:
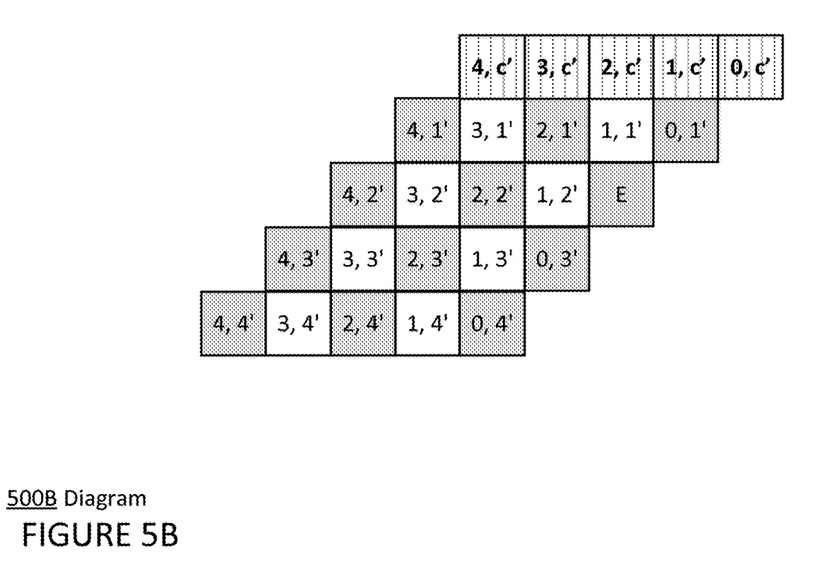

The de-interleaver 420 may be configured to reverse the interleaving performed by the interleaver of a transmit architecture of the other communication device, which may be similar to the interleaving process shown in FIG. 3. For example, as shown in FIG. 5B, the de-interleaver 420 may interleave the data that is output from the decoder, shown in FIG. 5A in a manner similar to the process shown in FIG. 3B, starting from block (0,c)' and ending with block (4,4)'.

Figure 5C:
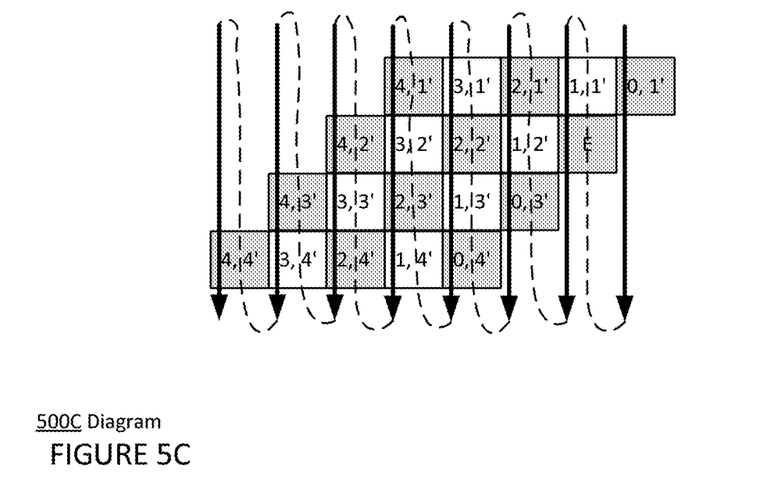
Figure 5D:
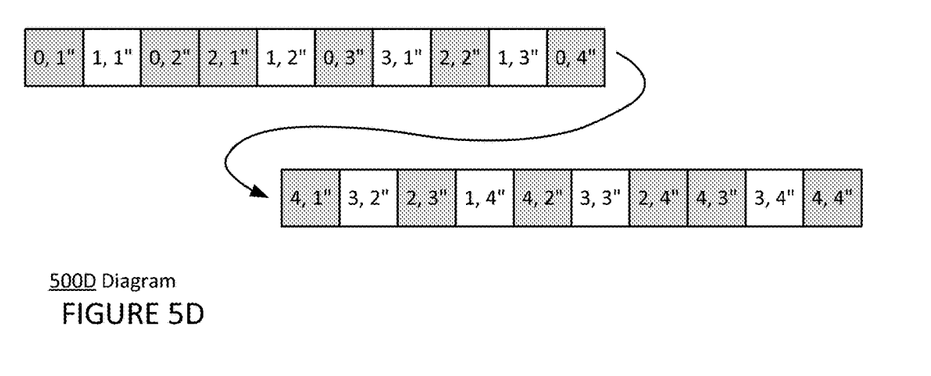
Figure 5E:
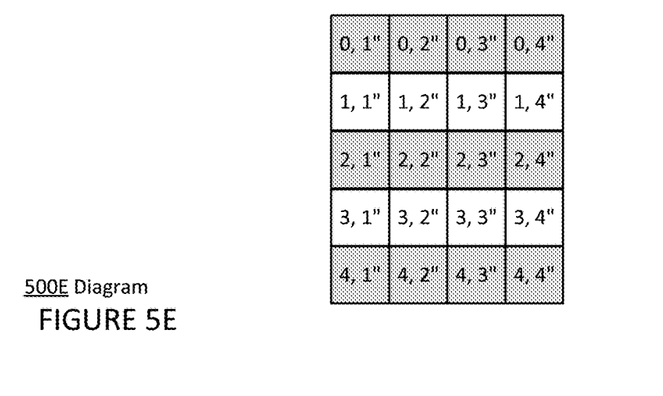

The correcting module 430 may include instructions for the one or more processors 104 to implement an erasure correction code based on the corrected blocks and erasure blocks received from the de-interleaver 420. The correcting module 430 may remove the column parity bits from the top of each column of the de-interleaved data. As shown in FIG. 5C, column parity bits (0,c)', (1, c)', (2, c)', (3, c)', and (4, c)' are removed from the data. In addition, the blocks of data are received from the de-interleaver 420 by columns, as indicated by the arrows in FIG. 3C. Erasures in the received data may be corrected using the erasure correction code. For example, erasure block E may be corrected to be block (0,2)". The output of the correcting module 430 in this example is therefore (0,1)", (1,1)", (0,2)", (2,1)", (1,2)", (0,3)", (3,1)", (2,2)", (1,3)", (0,4)", (4,1)", (3,2)", (2,3)", (1,4)", (4,2)", (3,3)", (2,4)", (4,3)", (3,4)", and (4,4)", as shown in FIG. 5D. Blocks that have been processed by correcting module 430 have been marked with a double prime (") symbol, The reordering module 440 includes instructions for the one or more processors 104 to reorder the corrected data so frames of the data are in the correct order. As shown in FIG. 5E, the data output from the correcting module 430 may be reordered in the rows and columns in which the data originally was transmitted. If ordering does not need to be preserved, the reordering module 440 may be omitted.

Figure 6:
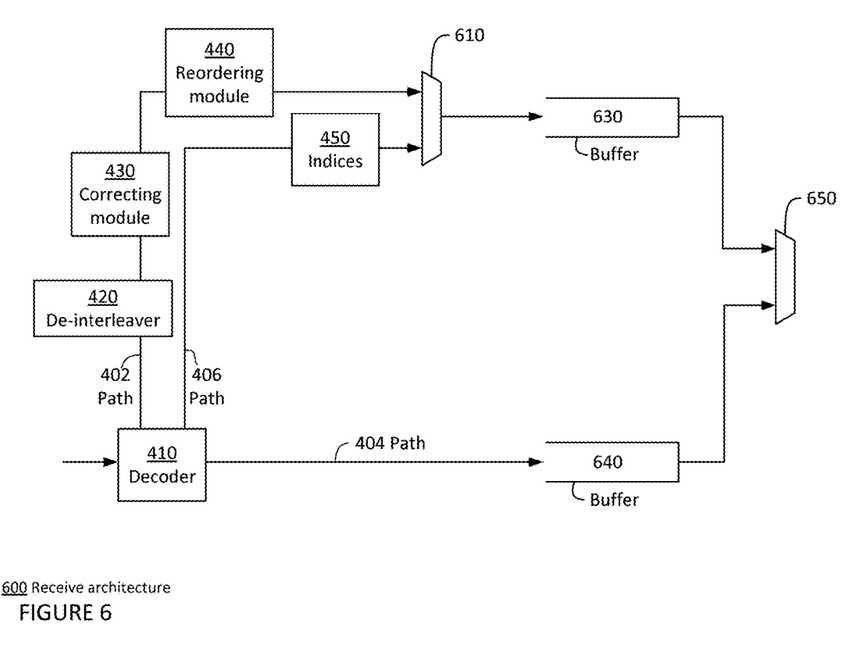
FIG. 6 is a pictorial diagram of a further receive architecture 600 in accordance with aspects of the disclosure.

As shown in FIG. 6, the corrected data may be received at a selection module 610. The selection module 610 may also receive indices of the erased blocks 450 from the decoder 410. The selection module 610 may be configured to select frames from the corrected data corresponding to the indices of the erased blocks 450 and forward the selected frames to a first buffer 630. Meanwhile, the received data may be forwarded along the fourth path to a second buffer 640. A multiplexer 650 is configured to insert the selected frames from the first buffer 630 into the locations of lost frames in the received data indicated by the indices of the erased blocks 450.

When no errors are detected in the received data, on the other hand, the received data may be forwarded along the fourth path and made available for processing without using the third path. Along the fourth path, received data is not processed for corrections and is directly forwarded for use by the one or more processors 104. Without being processed for corrections, the data is available quicker than if the data underwent the correction process along the third path.

To form a free-space optical (or RF) communication link between two communication devices, such as the first communication device 102 and the second communication device 122, the receiver and transmitter of the first communication device may be controlled to align with the transmitter and receiver, respectively, of the second communication device, respectively, so that data can be sent and received between them. In some implementations, the power of the signals transmitted by each transmitter can also be controlled by the one or more processors of respective communication devices to facilitate formation of the links 730-737 in the network 700 (see FIG. 7, for instance). For example, communication devices that are separated by a relatively large distance can be configured to operate at a higher power to compensate for the reduction in signal-to-noise ratio that occurs over the distance separating the two communication devices. Communication devices that are spaced nearer to one another may be controlled to operate at a relatively lower power so as to save power.

Figure 7:
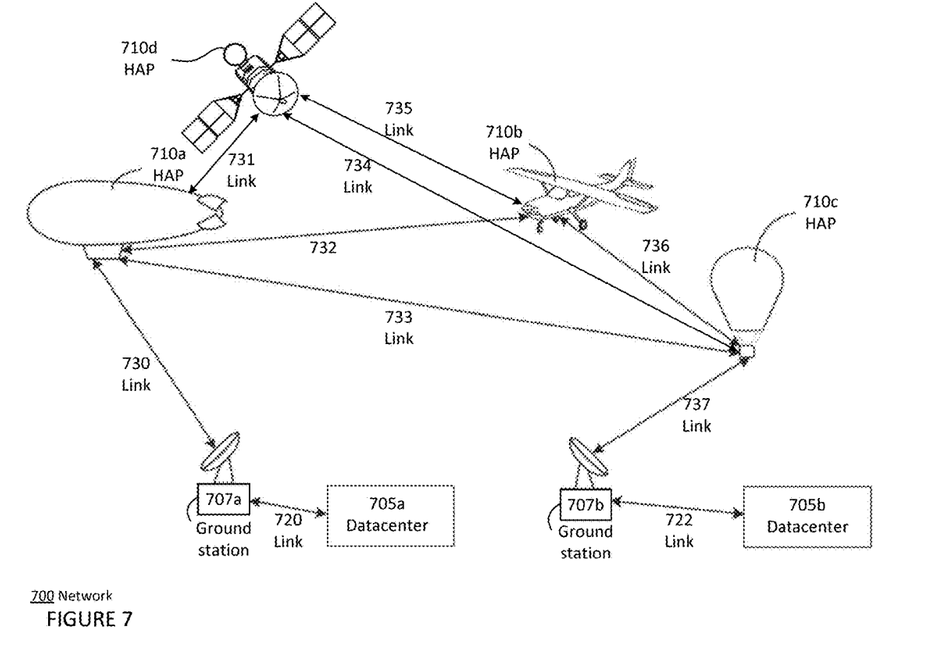
FIG. 7 is a pictorial diagram of a network 700 in accordance with aspects of the disclosure.

As shown in FIG. 7, a plurality of communication devices may be configured to form a plurality of communication links between a plurality of nodes and form a network 700. For example, the network 700 includes nodes associated with each of two land-based datacenters 705a and 705b (generally referred to as datacenters 705), nodes associated with each of two ground stations 707a and 707b (generally referred to as ground stations 707), and nodes associated with each of four airborne high altitude platforms (HAPs) 710a-710d (generally referred to as HAPs 710). As shown, HAP 710a is a blimp, HAP 710b is an airplane, HAP 710c is a balloon, and HAP 710d is a satellite. Any or all of these types of HAPs may be employed in the network 700. In some embodiments, nodes in network 700 may be equipped to perform FSOC, making network 700 an FSOC network. In alternate implementations, the network 700 is a terrestrial network comprising a plurality of communication devices on a plurality of terrestrial nodes.

Arrows shown between a pair of nodes represent possible communication links 720, 722, 730-737 between the nodes. The network 700 as shown in FIG. 7 is illustrative only, and in some implementations the network 700 may include additional or different nodes. For example, in some implementations, the network 700 may include additional HAPs, which may be balloons, blimps, airplanes, unmanned aerial vehicles (UAVs), satellites, or any other form of high altitude platform.

In some implementations, the network 700 may serve as an access network for client devices such as cellular phones, laptop computers, desktop computers, wearable devices, or tablet computers. The network 700 also may be connected to a larger network, such as the Internet, and may be configured to provide a client device with access to resources stored on or provided through the larger computer network. In some implementations, HAPs 710 can include wireless transceivers associated with a cellular or other mobile network, such as eNodeB base stations or other wireless access points, such as WiMAX or UMTS access points. Together, HAPs 710 may form all or part of a wireless access network. HAPs 710 may connect to the datacenters 705, for example, via backbone network links or transit networks operated by third parties. The datacenters 705 may include servers hosting applications that are accessed by remote users as well as systems that monitor or control the components of the network 700. HAPs 710 may provide wireless access for the users, and may route user requests to the datacenters 705 and return responses to the users via the backbone network links.

Example Methods

Figure 8:
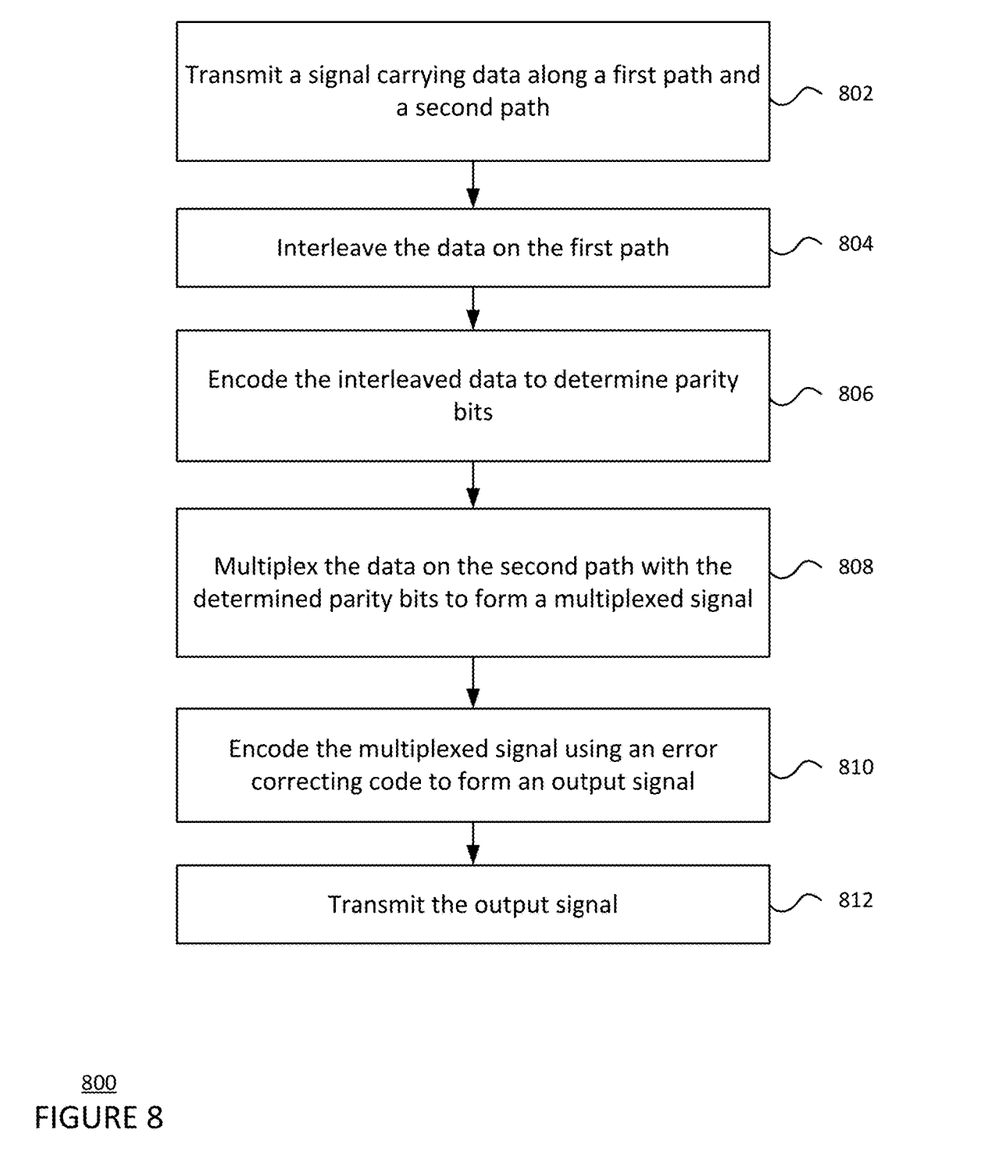
FIG. 8 is a flow diagram 800 in accordance with aspects of the disclosure.

In FIG. 8, flow diagram 800 is shown in accordance with some of the aspects described above that may be performed by the one or more processors 104 of the communication device 102. While FIG. 8 shows blocks in a particular order, the order may be varied and that multiple operations may be performed simultaneously. Also, operations may be added or omitted.

At block 802, the one or more processors 104 transmit a signal carrying data along two paths, a first path and a second path, such as first path 202 and second path 204. The signal may be received from another communication device or may be generated by the one or more processors 104. The signal may be split into a first portion along the first path and a second portion along the second path, where both the first portion and the second portion each carry the data.

At block 804, the data in the first portion of the signal is interleaved using a set interleaver design, as discussed above with respect to interleaver 210. The set interleaver design may include a delay block comprising a number of bytes, a number of interleaver rows, and an interleaver spread. For example, the set interleaver design may include a delay block having 15296 bytes, 100 interleaver rows, and an interleaver spread of 110 milliseconds. In some cases, the delay block may be smaller amount of bytes but repeated for a period of time. The interleaver of the transmit architecture may be a convolutional interleaver. In the alternative, a block interleaver or any other type of interleaver may be used. At block 806, the interleaved data of the first portion is encoded with an erasure correcting code by a first encoder, such as first encoder 220. The output of this operation is a set of parity bits from the erasure correcting code. For example, the set of parity bits may be column parity bits 310 of the interleaved data, as shown in FIG. 3B.

At block 808, the data in the second portion and the output parity bits of the erasure correcting code are multiplexed together by a multiplexer to form a multiplexed signal, such as by multiplexer 230. As shown in FIG. 3C, the column parity bits 310 may be inserted before a given row of data. At block 810, the multiplexed signal is encoded using an error correcting code at a second encoder to form an output signal, such as at second encoder 240. As further shown in FIG. 3C, the encoding may include determining row parity bits 320 and inserting them at the end of a given row. At block 812, the output signal is transmitted to a receiver of another communication device, such as communication device 122. Because the data on the second path is not interleaved, the data may be retrieved from the output signal by the other communication device immediately after decoding or may also be interleaved and otherwise processed in order to correct the data.

Figure 9:
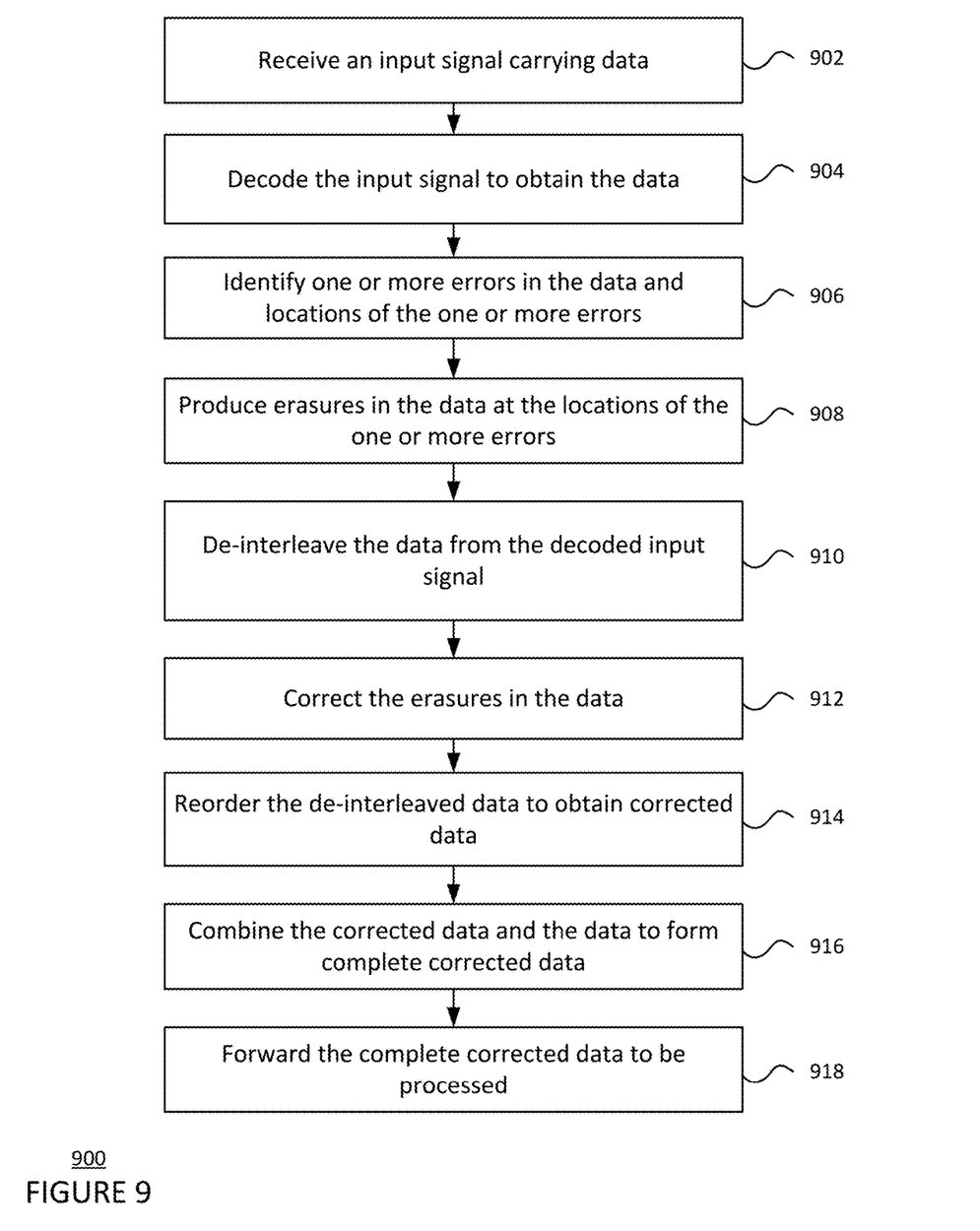
FIG. 9 is another flow diagram 900 in accordance with aspects of the disclosure.

In FIG. 9, flow diagram 900 is shown in accordance with some of the aspects described above that may be performed by the one or more processors 104 of the communication device 102. While FIG. 9 shows blocks in a particular order, the order may be varied and that multiple operations may be performed simultaneously. Also, operations may be added or omitted.

At block 902, the one or more processors 104 may be receive an input signal at a receive architecture. The receive architecture may have two paths, namely a third path and a fourth path, such as third path 402 and fourth path 404. The input signal carries data that has been multiplexed with parity bits based on an erasure correcting code and an error correcting code, for instance, column and row parity bits as described above with regard to FIG. 8. The erasure correcting code and the error correcting code may be preprogrammed or may be received by the one or more processors 104 prior to receiving the signal.

At block 904, the input signal is decoded using the error correcting code. A decoder, such as decoder 410 positioned at the beginning of the third path and the fourth path of the receive architecture may be used for this operation. The error correcting code is the inverse of the error correcting code used by the other communication device to process the data prior to transmission. The error correcting code may be configured to identify and remove row parity bits from the end of each row of the data in the input signal.

At block 906, the one or more processors 104 may identify one or more errors in the data of the input signal, as well as locations of the one or more errors. An error may be identified for a given block of data when the decoder is unable to decode the given block. When unable to decode the given block, the one or more processors 104 may identify the decoder failure and identify the given block as containing an error. When no errors are identified, the data is forwarded by the one or more processors 104 along the fourth path without any further decoding or de-interleaving. The data may be forwarded for further processing or other use by the communication device 102.

At block 908, one or more erasures may be produced in the data by the one or more processors 104. In addition to identifying and removing row parity bits, the error correcting code is configured to produce either corrected blocks or a block of erasures in place of blocks containing an error. The one or more processors 104 may therefore produce an erasure in place of blocks of the data in which the one or more errors are located. A location of each erasure may be identified using an index that identifies the given block that has been erased, or an index of an erased block.

At block 910, the data, including corrected blocks and the one or more erasures, is de-interleaved. A de-interleaver positioned on the third path of the receive architecture having a design configured to perform the set interleaver design of the interleaver of the transmit architecture of the other communication device, such as de-interleaver 420, may be used for this operation. At block 912, the erasures in the de-interleaved data may be corrected using the erasure correcting code. The one or more processors 104 may correct the erasures at a correcting module, such as correcting module 430.

At block 914, the one or more processors 104 reorder the de-interleaved data and output the data in the correct order. The reordering may be performed at a reordering module, such as reordering module 440. If ordering does not need to be preserved, this block may be omitted.

At block 916, the one or more processors 104 may combine the corrected data from the third path with the corrected data on the fourth path to form complete corrected data. The corrected data may be a subset of blocks from the reordered data that is selected based on the indices of the erased blocks. The indices, such as indices 450, may be received from the decoder 410 via fifth path 406 at selection module 610, and the subset of blocks may be selected by one or more processors 104 at selection module 610. The corrected data may correspond to data may have been lost when transmitted from the other communication device to the first communication device. The corrected data may be stored at buffer 630, and the data forwarded on the fourth path may be received and stored at buffer 640. At a multiplexer, such as multiplexer 650, the corrected data may be inserted into locations of the data on the fourth path that correspond to the locations of the one or more errors. The result of multiplexing in this way is a complete corrected data in the form of a correct data stream or data blocks that no longer has errors.

At block 918, the complete corrected data may be forwarded by the one or more processors 104. The data may be forwarded for further processing or other use by the communication device 102. The receive architecture having the third path and the fourth path as described above allows for quick retrieval of the data when no errors are present after correction but prior to de-interleaving, and for corrected data to be obtained when erasures are present. In this way, unnecessary delay of data retrieval may be reduced.

The features described herein allows the data to be immediately recovered when error-free (with only a short decoding delay), and for temporal diversity to be employed only when data is lost. In this way processing latency is increased only when necessary to recover data, such as when signal power decreases when communication devices change position or angle. Users may therefore receive correct data faster on average. A network having the features described above may be able to transmit a greater amount of data overall, since data may be delayed as much, and therefore may be able to server a greater number of customers.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A method comprising:
   transmitting, by one or more processors of a communication device, a signal carrying data on a first path and a second path;
   interleaving, by the one or more processors, the data on the first path;
   encoding, by the one or more processors, the interleaved data to determine parity bits;
   multiplexing, by the one or more processors, the data on the second path with the determined parity bits to form a multiplexed signal;
   encoding, by the one or more processors, the multiplexed signal using an error correcting code to form an output signal; and
   transmitting, by the one or more processors, the output signal.

2. The method of claim 1, wherein the data is interleaved using a convolutional interleaver.

3. The method of claim 1, wherein the output signal is transmitted as a free-space optical communication signal.

4. The method of claim 1, further comprising:
   receiving, by one or more second processors of a second communication device, the output signal as an input signal;
   decoding, by the one or more second processors, the input signal to identify second data; and
   extracting, by the one or more second processors, the second data from the input signal for processing.

5. The method of claim 1, further comprising:
   receiving, by one or more second processors of a second communication device, the output signal as an input signal;
   decoding, by the one or more second processors, the input signal to obtain second data;
   identifying, by the one or more second processors, one or more errors in the input signal and locations of the one or more errors;
   producing, by the one or more second processors, one or more erasures in the second data at the locations of the one or more errors;
   de-interleaving, by the one or more second processors, the second data in the input signal;
   correcting, by the one or more second processors, the one or more erasures to obtain corrected second data; and
   combining, by the one or more second processors, the corrected second data and the second data to form complete corrected data.

6. The method of claim 5, wherein the corrected second data and the second data is combined by:
   receiving an index indicating a location of the one or more erasures; and
   replacing portions of the second data with portions of the corrected second data according to the index.

7. The method of claim 5, wherein correcting the second data includes reordering the de-interleaved second data.

8. The method of claim 5, wherein the corrected second data and the second data are combined by inserting the corrected second data in locations in the second data, the locations in the second data corresponding to at least one of the locations of the one or more errors.

9. A wireless communication system comprising:
   a transmitter including:
      an interleaver configured to interleave data,
      a first encoder configured to encode the interleaved data to determine parity bits,
      a multiplexer configured to multiplex the data with the determined parity bits, and
      a second encoder implementing an error correcting code, the second encoder being configured to encode the multiplexed data.

10. The wireless communication system of claim 9, wherein the interleaver is a convolutional interleaver.

11. The wireless communication system of claim 9, wherein the transmitter is configured to transmit the multiplexed data using a free-space optical communication signal.

12. The wireless communication system of claim 9, further comprising:
   a receiver including a decoder configured to decode an input signal to obtain second data; and
   one or more processors configured to extract the second data from the input signal for processing.

13. The wireless communication system of claim 9, further comprising:
   a receiver including:
      a decoder being configured to decode an input signal to obtain second data, and a de-interleaver configured to de-interleave the second data; and
one or more processors configured to:
correct the second data where erasures are located;
combine the corrected second data and the second data to form complete corrected data; and
forward the complete corrected data for processing.

14. The wireless communication system of claim 13, wherein the one or more processors are further configured to:
identify one or more errors in the second data and locations of the one or more errors;
wherein the second data is corrected based on the locations of the one or more errors.

15. The wireless communication system of claim 14, wherein the decoder is further configured to produce an erasure in the second data at the locations of the one or more errors.

16. The wireless communication system of claim 14, wherein the corrected second data and the second data are combined by inserting the corrected second data in locations in the second data, the locations in the second data corresponding to the locations of the one or more errors.

17. The wireless communication system of claim 13, wherein correcting the second data includes reordering the second data.

18. A non-transitory, tangible computer-readable storage medium on which computer readable instructions of a program are stored, the instructions, when executed by one or more processors of a communication device, cause the one or more processors to perform a method, the method comprising:
transmitting a signal carrying data on a first path and a second path;
interleaving the data on the first path;
encoding the interleaved data to determine parity bits;
multiplexing the data on the second path with the determined parity bits to form a multiplexed signal;
encoding the multiplexed signal using an error correcting code to form an output signal; and
transmitting the output signal to a remote communication device.

19. The medium of claim 18, wherein the method further comprises:
receiving the output signal as an input signal;
decoding the input signal to obtain second data; and
extracting the second data from the input signal for processing.

20. The medium of claim 18, wherein the method further comprises:
receiving the output signal as an input signal;
decoding the input signal to obtain second data;
identifying one or more errors in the second data and locations of the one or more errors;
producing one or more erasures in the second data at the locations of the one or more errors;
correcting the one or more erasures to obtain corrected second data; and
combining the corrected second data and the second data to form complete corrected data.

* * * * *